United States Patent
Hsiung et al.

(10) Patent No.: US 11,217,693 B2
(45) Date of Patent: Jan. 4, 2022

(54) SEMICONDUCTOR TRANSISTOR AND FABRICATION METHOD THEREOF

(71) Applicant: UNITED MICROELECTRONICS CORP., Hsin-Chu (TW)

(72) Inventors: Chang-Po Hsiung, Hsinchu (TW); Shin-Hung Li, Nantou County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 6 days.

(21) Appl. No.: 16/711,442

(22) Filed: Dec. 12, 2019

(65) Prior Publication Data

US 2021/0167208 A1 Jun. 3, 2021

(30) Foreign Application Priority Data

Nov. 28, 2019 (CN) .......................... 201911188611.2

(51) Int. Cl.
| | | |
|---|---|---|
| H01L 29/78 | (2006.01) | |
| H01L 21/28 | (2006.01) | |
| H01L 29/66 | (2006.01) | |
| H01L 29/423 | (2006.01) | |

(52) U.S. Cl.
CPC .... *H01L 29/7836* (2013.01); *H01L 21/28211* (2013.01); *H01L 29/42368* (2013.01); *H01L 29/66636* (2013.01)

(58) Field of Classification Search
CPC .......... H01L 29/7836; H01L 21/28211; H01L 29/42368; H01L 29/66636
See application file for complete search history.

(56) References Cited

U.S. PATENT DOCUMENTS

| | | | |
|---|---|---|---|
| 5,684,317 A | 11/1997 | Hwang | |
| 5,877,527 A * | 3/1999 | Okabe | ................. H01L 29/7397 257/328 |
| 7,247,919 B1 | 7/2007 | Mouli | |
| 2008/0233725 A1* | 9/2008 | Forbes | .............. H01L 29/66772 438/585 |
| 2010/0052091 A1* | 3/2010 | Tanaka | ................ H01L 29/7393 257/501 |
| 2016/0141359 A1* | 5/2016 | Yang | ................... H01L 29/0649 257/337 |
| 2017/0309744 A1* | 10/2017 | Tsai | ....................... H01L 21/761 |
| 2019/0363185 A1* | 11/2019 | You | ..................... H01L 29/7816 |

OTHER PUBLICATIONS

Sjoblom, Metal Gate Technology for Advanced CMOS Devices, Uppsala Dissertations from the Faculty of Science and Technology (Year: 2006).*

* cited by examiner

*Primary Examiner* — Syed I Gheyas
(74) *Attorney, Agent, or Firm* — Winston Hsu

(57) ABSTRACT

A semiconductor transistor includes a first lightly doped-drain region disposed in a drain region of a semiconductor substrate; a first heavily doped region disposed in the first lightly doped-drain region; and a gate located on the channel region; a gate oxide layer between the gate and the channel region; and a first insulating feature disposed in the first lightly doped-drain region between the channel region and the first heavily doped region. The gate overlaps with the first insulating feature. The thickness of the first insulating feature is greater than that of the gate oxide layer.

17 Claims, 6 Drawing Sheets

SEMICONDUCTOR TRANSISTOR AND FABRICATION METHOD THEREOF

BACKGROUND OF THE INVENTION

1. Field of the Invention

The present invention relates to the field of semiconductor technology, and in particular, to a semiconductor transistor and a manufacturing method thereof.

2. Description of the Prior Art

In a medium-voltage (Vd>8V) or high-voltage MOS transistor, a lightly-doped drain region is typically utilized to isolate a heavily-doped drain region from the substrate. This isolation reduces the doping concentration at the drain-to-substrate junction which, in turn, reduces the intensity of the electric field at the junction. As a result, a substantially large reverse-bias can be applied across the junction without inducing an avalanche breakdown.

The problems faced by the existing medium-voltage or high-voltage MOS transistors are high off-current (Ioff) and off-current walk out effect. The high Ioff is usually caused by gate induced drain leakage (GIDL). In addition, during medium-voltage or high-voltage operation, the hot carrier injection (HCI) phenomenon leads to a higher substrate current (Isub), which causes reliability problems. It is very difficult to improve both the HCI phenomenon and GIDL.

SUMMARY OF THE INVENTION

One object of the present invention is to provide a medium-voltage or high-voltage MOS transistor to overcome the deficiencies and disadvantages in the prior art.

One aspect of the invention provides a semiconductor transistor including a semiconductor substrate of a first conductivity type having a main surface. A drain region, a source region spaced apart from the drain region, and a channel region between the drain region and the source region are defined in the main surface. A first lightly doped-drain region of a second conductivity type is disposed in the semiconductor substrate within the drain region. A first heavily doped region of the second conductivity type is disposed within the first lightly doped-drain region. A gate is disposed over the channel region. A gate oxide layer is disposed between the gate and the channel region. A first insulating feature is disposed at the main surface and situated within the first lightly doped-drain region between the channel region and the first heavily doped region. The gate overlaps with the first insulating feature. The first insulating feature is thicker than the gate oxide layer.

According to some embodiments, the first conductivity type is P type and the second conductivity type is N type.

According to some embodiments, the first lightly doped-drain region encompasses the first heavily doped region and isolates the first heavily doped region from the semiconductor substrate.

According to some embodiments, the first insulating feature is in direct contact with the gate oxide layer.

According to some embodiments, the first insulating feature comprises a lower portion under the main surface of the semiconductor substrate.

According to some embodiments, the lower portion encroaches into the main surface of the semiconductor substrate, thereby forming a curved bottom surface of the lower portion under the main surface. The curved bottom surface of the lower portion is situated between the channel region and the first heavily doped region.

According to some embodiments, the first insulating feature comprises an upper portion above the main surface of the semiconductor substrate.

According to some embodiments, the upper portion comprises a top surface having a bow shape in cross-sectional view.

According to some embodiments, the gate is a metal gate.

According to some embodiments, the semiconductor transistor further comprises a spacer on a sidewall of the gate.

According to some embodiments, the spacer is situated on the upper portion.

According to some embodiments, the semiconductor transistor further comprises: a second lightly doped-drain region of a second conductivity type disposed in the semiconductor substrate within the source region; a second heavily doped region of the second conductivity type disposed within the second lightly doped-drain region; and a second insulating feature disposed at the main surface and situated within the second lightly doped-drain region between the channel region and the second heavily doped region. The gate overlaps with the second insulating feature. The second insulating feature is thicker than the gate oxide layer.

Another aspect of the invention provides a method for forming a semiconductor transistor. A semiconductor substrate of a first conductivity type having a main surface is provided. A drain region, a source region spaced apart from the drain region, and a channel region between the drain region and the source region are defined in the main surface. A first insulating feature is formed at the main surface and within the first lightly doped-drain region between the channel region and the first heavily doped region. A first lightly doped-drain region of a second conductivity type is formed in the semiconductor substrate within the drain region. A first heavily doped region of the second conductivity type is formed within the first lightly doped-drain region. A gate oxide layer is formed on the channel region. A gate is formed on the gate oxide layer. The gate overlaps with the first insulating feature. The first insulating feature is thicker than the gate oxide layer.

According to some embodiments, the first conductivity type is P type and the second conductivity type is N type.

According to some embodiments, the first lightly doped-drain region encompasses the first heavily doped region and isolates the first heavily doped region from the semiconductor substrate.

According to some embodiments, the first insulating feature comprises a lower portion under the main surface of the semiconductor substrate. The lower portion encroaches into the main surface of the semiconductor substrate, thereby forming a curved bottom surface of the lower portion under the main surface. The curved bottom surface of the lower portion is situated between the channel region and the first heavily doped region.

According to some embodiments, the first insulating feature comprises an upper portion above the main surface of the semiconductor substrate. The upper portion comprises a top surface having a bow shape in cross-sectional view.

According to some embodiments, the gate is a metal gate.

According to some embodiments, the method further comprises: forming a spacer on a sidewall of the gate. The spacer is situated on the upper portion.

According to some embodiments, the method further comprises: forming a second lightly doped-drain region of a second conductivity type in the semiconductor substrate within the source region; forming a second heavily doped region of the second conductivity type within the second lightly doped-drain region; and forming a second insulating feature at the main surface and within the second lightly doped-drain region between the channel region and the second heavily doped region. The gate overlaps with the second insulating feature. The second insulating feature is thicker than the gate oxide layer.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
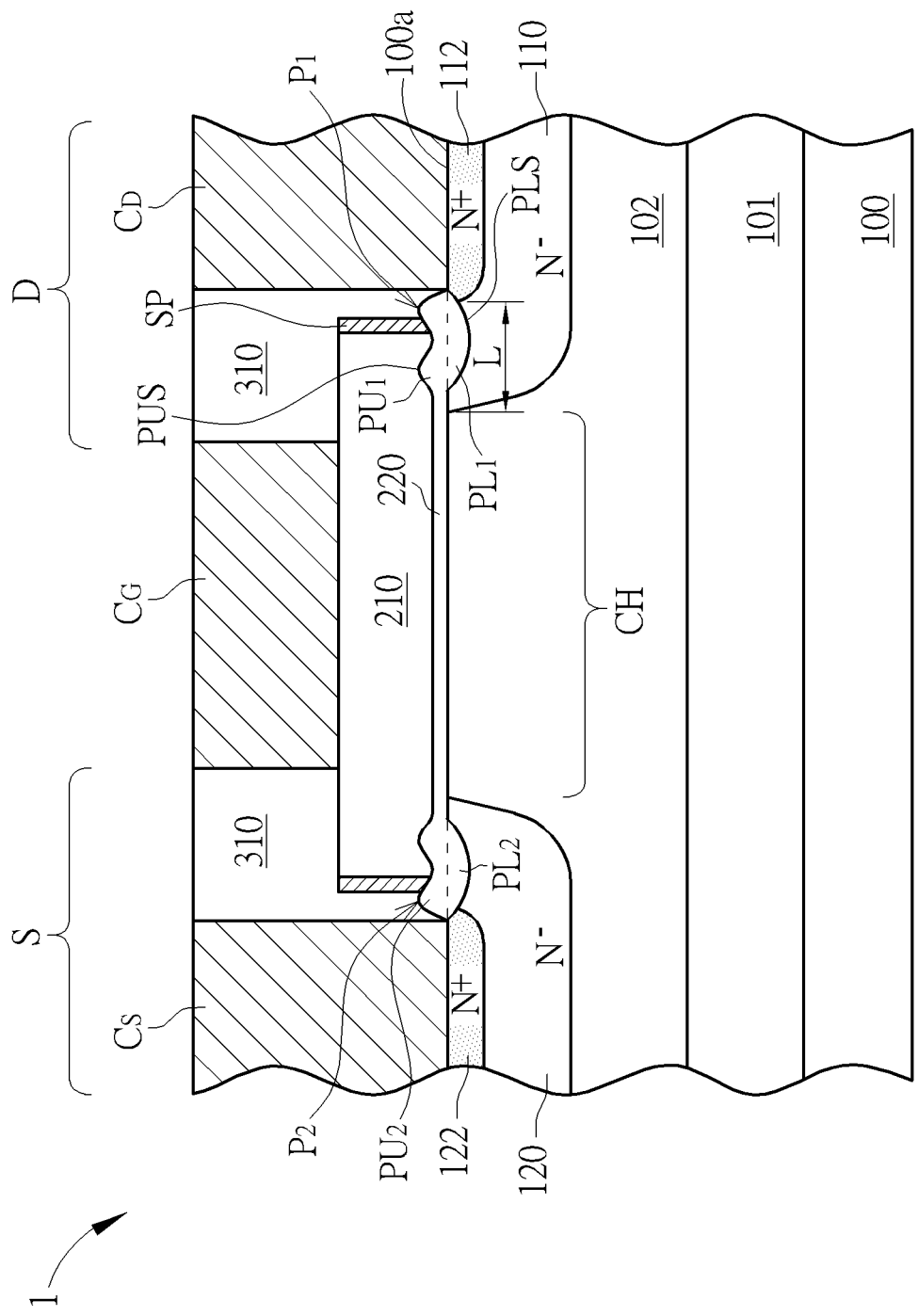
FIG. 1 is a schematic cross-sectional view of a semiconductor transistor according to an embodiment of the present invention.

Please refer to FIG. 1, which is a schematic cross-sectional view of a semiconductor transistor according to an embodiment of the present invention. As shown in FIG. 1, the semiconductor transistor 1 includes a semiconductor substrate 100 having a first conductivity type, such as a silicon substrate, but is not limited thereto. The first conductivity type may be P-type. According to an embodiment of the present invention, for example, the semiconductor substrate 100 may be a P-type silicon substrate (P substrate). According to an embodiment of the present invention, a deep N-well 101 may be optionally disposed in the semiconductor substrate 100. According to an embodiment of the present invention, a P-well 102 may be optionally disposed in the semiconductor substrate 100 above the deep N-well 101. A drain region D, a source region S spaced from the drain region D, and a channel region CH between the drain region D and the drain region S are defined at the main surface 100a of the semiconductor substrate 100.

According to an embodiment of the present invention, a first lightly doped-drain region 110 having a second conductivity type is disposed in the semiconductor substrate 100 within the drain region D. The second conductivity type may be N-type. Within the first lightly doped-drain region 110, a first heavily doped region 112 having a second conductivity type is provided. The second conductivity type may be N-type. For example, the first heavily doped region 112 may be $N^+$ doped region having a higher doping concentration than the first lightly doped-drain region 110. According to an embodiment of the invention, the first lightly doped-drain region 110 encompasses the first heavily doped region 112 and electrically isolates the first heavily doped region 112 from the P-type well 102 of the semiconductor substrate 100.

According to an embodiment of the present invention, the semiconductor transistor 1 further comprises a second lightly doped-drain region 120 having a second conductivity type disposed in the semiconductor substrate 100 within the source region S. The second conductivity type may be N type. Within the second lightly doped-drain region 120, a second heavily doped region 122 having the second conductivity type is provided. The second conductivity type may be N-type. For example, the second heavily doped region 122 may be $N^+$ doped region having a higher doping concentration than the second lightly doped-drain region 120. According to an embodiment of the present invention, the second lightly doped-drain region 120 encompasses the second heavily doped region 122 and electrically isolates the second heavily doped region 122 from the P-type well 102 of the semiconductor substrate 100. According to an embodiment of the present invention, the channel region CH is a region between the first lightly doped-drain region 110 and the second lightly doped-drain region 120 near the main surface 100a of the semiconductor substrate 100.

According to an embodiment of the present invention, a gate 210 is provided on the channel region CH. For example, the gate 210 may be a metal gate. The structure and manufacturing method of the metal gate are well known techniques, so the metal gate structure is not described in detail. Generally, a metal gate can be formed using a replacement metal gate (RMG) process. A gate oxide layer 220 is disposed between the gate 210 and the channel region CH. For example, the gate oxide layer 220 may be a silicon dioxide layer. According to an embodiment of the present invention, for example, the semiconductor transistor 1 may be a medium-voltage MOS transistor, and the thickness of the gate oxide layer 220 is about 200 angstroms. As shown in FIG. 1, the thickness of the gate oxide layer 220 above the channel region CH remains approximately the same. That is, the gate oxide layer 220 has a uniform thickness above the channel region CH.

According to an embodiment of the present invention, a first insulating feature $P_1$ is disposed on the main surface 100a in the first lightly doped-drain region 110 between the channel region CH and the first heavily doped region 112. The gate 210 overlaps with the first insulating feature $P_1$. According to an embodiment of the present invention, the distance L between the channel region CH and the first heavily doped region 112 is, for example, about 0.2 micrometers. According to an embodiment of the invention, the first insulating feature $P_1$ is interposed between the edge of the gate 210 and the first heavily doped region 112. According to an embodiment of the present invention, the thickness of the first insulating feature $P_1$ is greater than the thickness of the gate oxide layer 220. For example, the thickness of the first insulating feature $P_1$ is between about 400 angstroms and about 600 angstroms. According to an embodiment of the present invention, the first insulating feature $P_1$ does not extend into the channel region CH to avoid affecting the operation performance of the semiconductor transistor, such as drive current.

According to the embodiment of the present invention, the first insulating feature $P_1$ is in direct contact with the gate oxide layer 220. According to an embodiment of the present invention, the first insulating feature $P_1$ includes a lower portion $PL_1$ lower than the main surface 100a of the semiconductor substrate 100. According to the embodiment of the present invention, the lower $PL_1$ encroaches or sinks downwardly into the main surface 100a of the semiconductor substrate 100 and a curved bottom surface PLS of the lower $PL_1$ is formed below the main surface 100a. The curved bottom surface PLS of the lower PL1 is located between the channel region CH and the first heavily doped regions 112. In the middle or high voltage operation, the hot carrier generation center can be remote from the lower surface of the gate 210 or the surface of the channel region CH, thereby reducing the substrate current (Isub), which improves the reliability problem caused by hot carrier injection (HCI).

Figure 2:
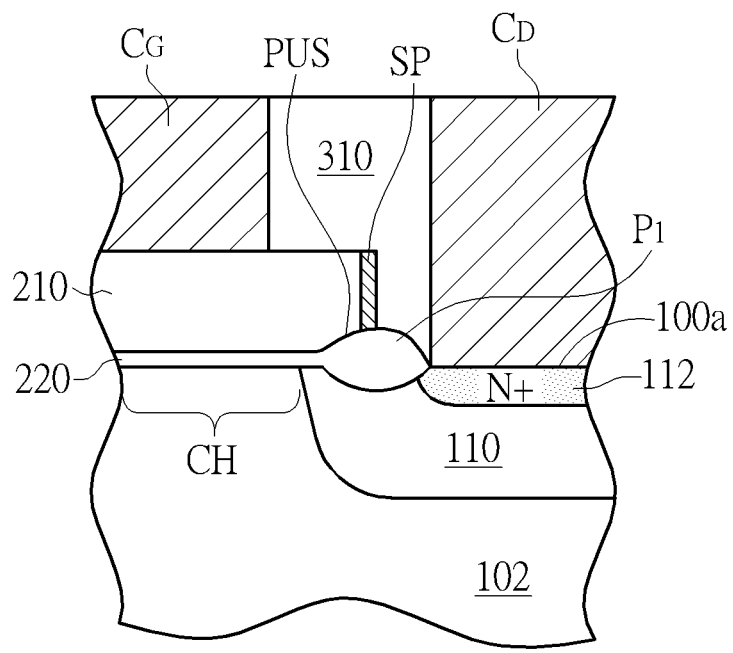
FIG. 2 is a schematic partial cross-sectional view of a semiconductor transistor according to another embodiment of the present invention, in which the upper surface of the first insulating feature is exemplified as being arc-shaped.

According to an embodiment of the present invention, the first insulating feature $P_1$ includes an upper portion $PU_1$ higher than the main surface 100a of the semiconductor substrate 100. According to an embodiment of the present invention, the upper portion $PU_1$ includes an upper surface PUS, and the upper surface PUS has a bow shape in cross-sectional view. According to an embodiment of the present invention, the upper surface PUS may have a wave-shaped cross-sectional profile. According to an embodiment of the present invention, the upper surface PUS may have an arc-shaped cross-sectional profile, as shown in FIG. 2.

According to the embodiment of the present invention, the semiconductor transistor 1 may further include a spacer SP disposed on a sidewall of the gate 210. According to the embodiment of the present invention, the spacer SP may be located on the upper portion $PU_1$ of the first insulating feature $P_1$, and the spacer SP may be in direct contact with the upper portion $PU_1$ of the first insulating feature $P_1$.

According to an embodiment of the present invention, optionally, a second insulating feature $P_2$ may be disposed in the second lightly doped-drain region 120 on the main surface 100a and located between the channel region CH and the second heavily doped region 122. The structure of the second insulating feature $P_2$ is approximately the same as the first insulating feature $P_1$, and the details of the second insulating feature $P_2$ are not described herein. According to the embodiment of the present invention, the gate 210 overlaps with the second insulating feature $P_2$, and the thickness of the second insulating feature $P_2$ is greater than the thickness of the gate oxide layer 220. Similarly, the second insulating feature $P_2$ includes an upper portion $PU_2$ above the main surface 100a of the semiconductor substrate 100 and a lower portion $PL_2$ below the main surface 100a of the semiconductor substrate 100.

According to an embodiment of the present invention, a dielectric layer 310 may be formed on the semiconductor substrate 100, for example, a silicon oxide layer, so that the dielectric layer 310 covers the semiconductor transistor 1, including the gate 210, the spacer SP, the first insulating feature $P_1$, the second insulating feature $P_2$, the drain region D and the source region S. According to an embodiment of the present invention, contact plugs $C_G$, $C_D$, and $C_S$ may be disposed in the dielectric layer 310 and electrically connected to the gate 210, the first heavily doped region 112, and the second heavily doped region 122, respectively.

The semiconductor transistor of the present invention features the first insulating feature $P_1$ provided in the drain region D, which is interposed between the edge of the gate 210 and the first heavily doped region 112, where a high electric field is produced when the semiconductor transistor is operated at medium or high voltages (for example, Vd>8V), so this area is also the hot carrier generation center, and hot carrier injection (HCI) is most likely to occur in this small area. The lower portion $PL_1$ of the first insulating feature $P_1$ of the present invention encroaches or sinks downwardly into the main surface 100a of the semiconductor substrate 100, and the curved bottom surface PLS of the lower portion $PL_1$ is formed below the main surface 100a. The curved bottom surface PLS of the lower portion $PL_1$ is located between the channel region CH and the first heavily doped region 112. This way, during medium or high voltage operation, the hot carrier generation center can be remote from the lower surface of the gate 210 or the surface of the channel region CH, thereby reducing the substrate current (Isub), and reliability issues caused by hot carrier injection (HCI) can be improved. In addition, the thickness of the first insulating feature $P_1$ is greater than the thickness of the gate oxide layer 220, which can improve the gate induced drain leakage (GIDL) problem.

Another aspect of the present invention provides a method for forming a semiconductor transistor. Please refer to FIG. 3 to FIG. 10, which are schematic cross-sectional views illustrating a method for manufacturing the semiconductor transistor 1 in FIG. 1 according to another embodiment of the present invention. The same elements, materials, layers, or regions are designated by the same symbols or numeral numbers. It can be seen from FIG. 1 that the semiconductor transistor 1 has a left-right symmetrical structure. Therefore, for the sake of simplicity, FIG. 3 to FIG. 10 only illustrate the structure of the right half of the semiconductor transistor near the drain region. Of course, those skilled in the art should understand that the first insulating feature $P_1$ can also be fabricated only in the drain region of the semiconductor transistor 1 to form a left-right asymmetric structure.

Figure 3:
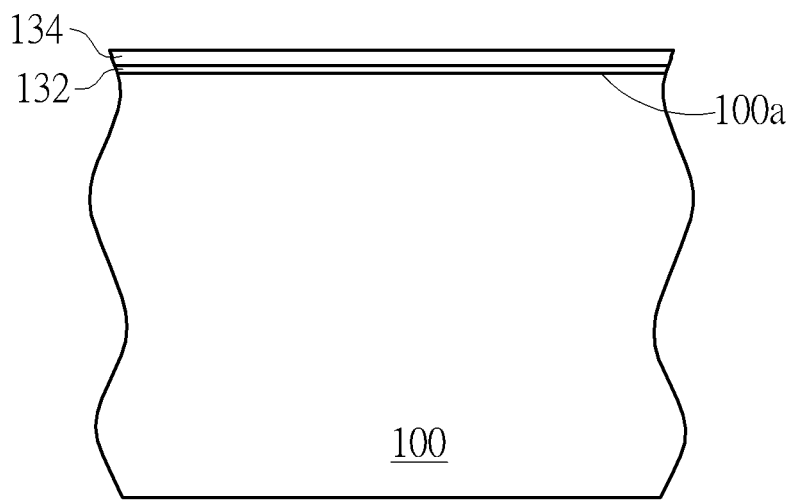
FIG. 3 to FIG. 10 are schematic cross-sectional views illustrating a method for manufacturing the semiconductor transistor in FIG. 1 according to another embodiment of the present invention.

As shown in FIG. 3, a semiconductor substrate 100 having first conductivity type (for example, P-type) is first provided. A drain region D, a source region S (in FIG. 1), and a channel region CH between the drain region D and the drain region S are defined on a main surface 100a of the semiconductor substrate 100. A silicon oxide layer 132 and a silicon nitride pad layer 134 are formed on the main surface 100a of the semiconductor substrate 100.

Figure 4:
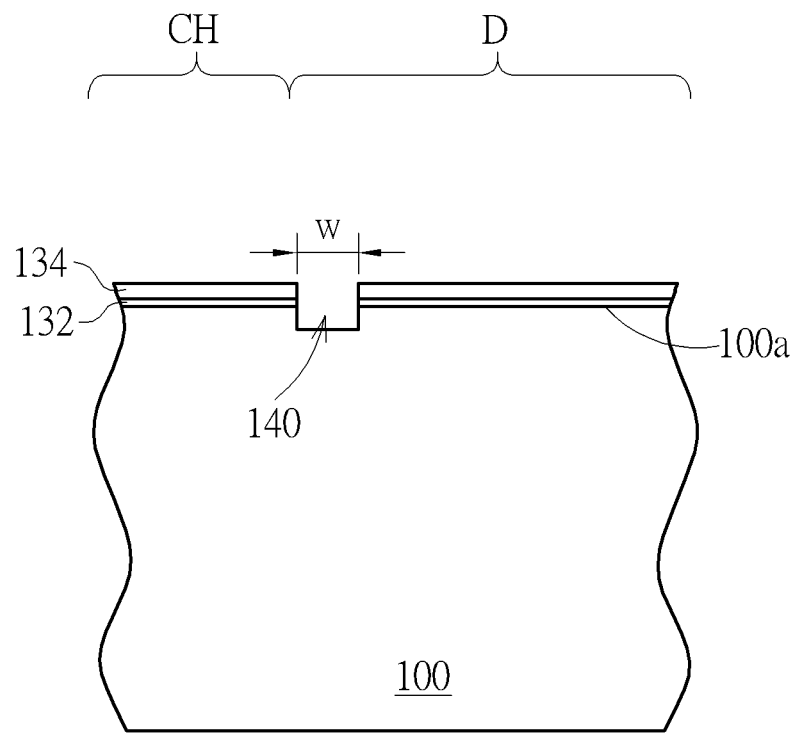

As shown in FIG. 4, a lithography process and an etching process are subsequently performed to form a recessed region 140 in the main surface 100a of the semiconductor substrate 100. The recessed region 140 is located in the drain region D and is in proximity to the channel region CH. According to an embodiment of the present invention, for example, the width w of the recessed region 140 may be equal to the critical dimension (CD). For example, the width w of the recessed region 140 may be less than or equal to 0.144 micrometers, but is not limited thereto. For example, the depth of the recessed region 140 is about 300 angstroms below the main surface 100a.

Figure 5:
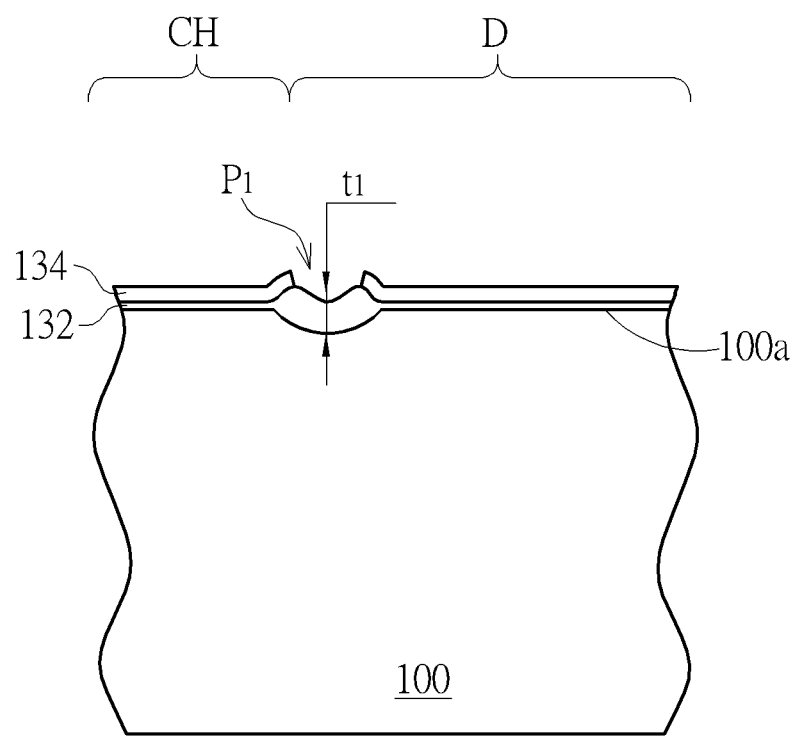

As shown in FIG. 5, an oxidation process is performed to form a first insulating feature $P_1$ in the recessed region 140 on the main surface 100a, and the thickness $t_1$ of the first insulating feature $P_1$ is about 700 to 800 angstroms, for example, 760 angstroms. According to an embodiment of the present invention, the steps of FIGS. 4 and 5 can be performed concurrently with the formation of a high-voltage gate oxide layer in a high-voltage device region. That is, at this point, the thickness of the first insulating feature $P_1$ is approximately the same as the thickness of the high-voltage gate oxide layer (not shown) in the high-voltage device region. Although not shown in the figures, those skilled in the art should understand that the second insulating feature P₂ (as depicted in FIG. 1) can be formed in the semiconductor substrate 100 in the source region S concurrently.

Figure 6:
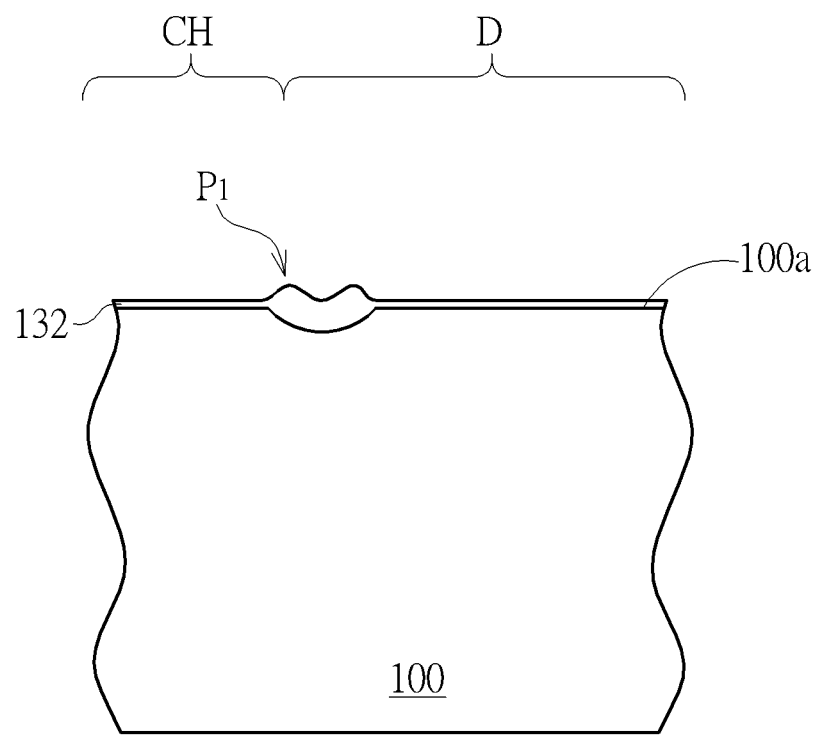

As shown in FIG. 6, the silicon nitride pad layer 134 is then removed by etching (for example, wet etching), leaving the silicon oxide layer 132 and the first insulating feature P₁ intact. At this point, the first insulating feature P₁ may be partially consumed. For example, the first insulating feature P₁ having a thickness of about 60 to 80 angstroms is removed in this step.

Figure 7:
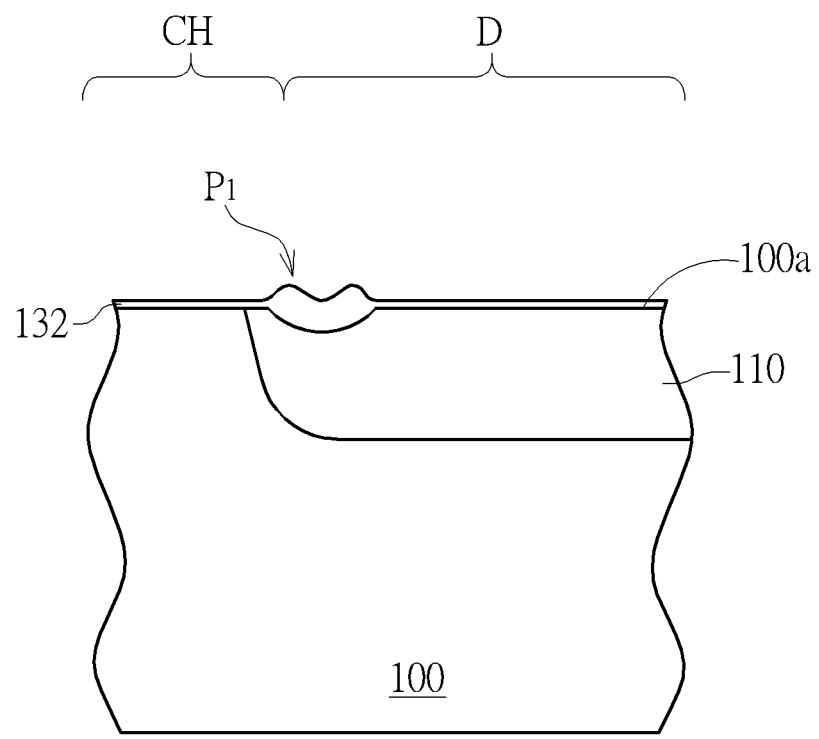

As shown in FIG. 7, a lithography process and an ion implantation process are subsequently performed to form a first lightly doped-drain region 110 having second conductivity type (for example, N-type) in the semiconductor substrate 100 within the drain region D. Although not shown in the figures, those skilled in the art should understand that a second lightly doped-drain region 120 having second conductivity type can be simultaneously formed in the semiconductor substrate 100 within the source region S (as shown in FIG. 1).

Figure 8:
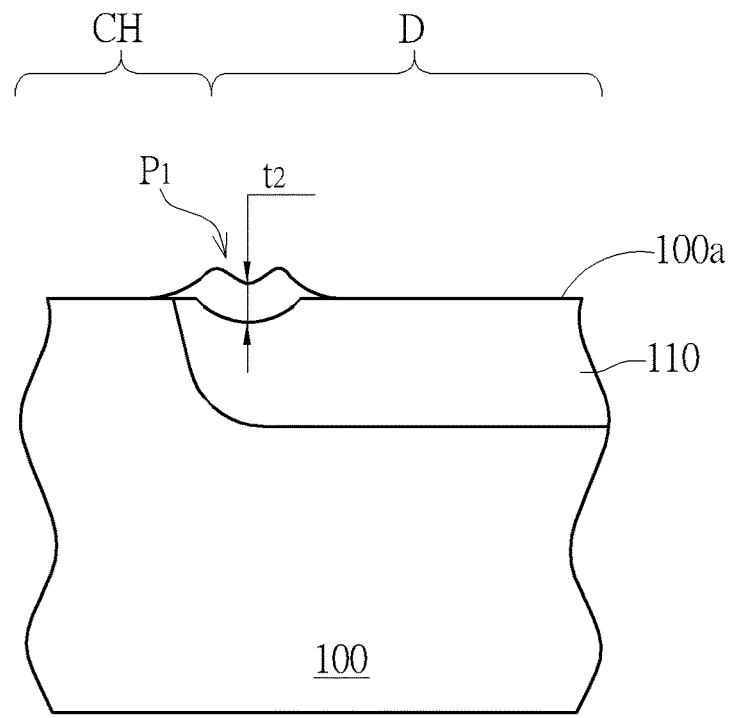

As shown in FIG. 8, subsequently, a cleaning process may be performed to remove the silicon oxide layer 132 on the main surface 100a of the semiconductor substrate 100, thereby exposing the main surface 100a. This cleaning step will also cause loss of thickness of the first insulating feature P₁. For example, the first insulating feature P₁ of about 110 angstroms will be removed in this step, so the thickness t₂ of the remaining first insulating feature P₁ is about 500 angstroms to about 600 angstroms.

Figure 9:
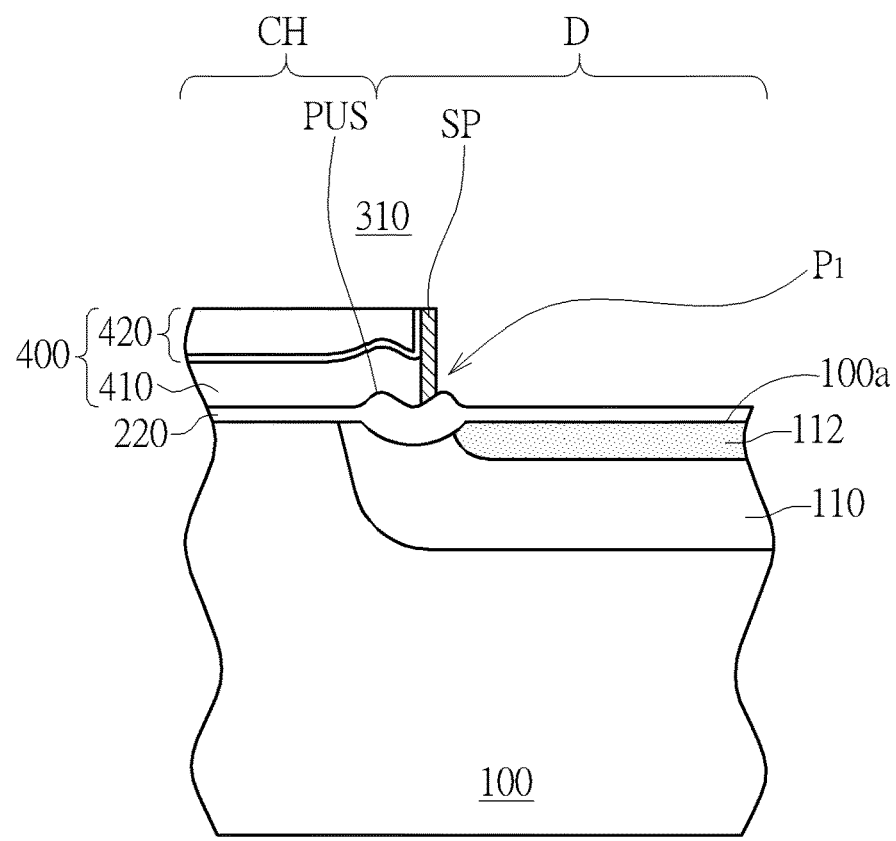

As shown in FIG. 9, an oxidation process is subsequently performed to form a gate oxide layer 220 on the channel region CH, a sacrificial gate structure 400 is formed on the gate oxide layer 220, and a spacer SP is formed on a sidewall of the sacrificial gate structure 400. The sacrificial gate structure 400 may include a polysilicon layer 410 and a hard mask layer 420. The spacer SP may be a silicon nitride sidewall spacer, but is not limited thereto. The spacer SP is located on the first insulating feature P₁, and the spacer SP directly contacts the first insulating feature P₁.

Subsequently, an ion implantation process is performed to form a first heavily doped region 112 having second conductivity type (for example, N-type) in the first lightly doped-drain region 110. The first lightly doped-drain region 110 encompasses the first heavily doped region 112 and electrically isolates the first heavily doped region 112 from the semiconductor substrate 100. Although not shown in the figure, those skilled in the art should understand that at this point, a second heavily doped region 122 having second conductivity type (shown in FIG. 1) can be formed in the second lightly doped-drain region 120 in the semiconductor substrate 100 within the source region S.

Figure 10:
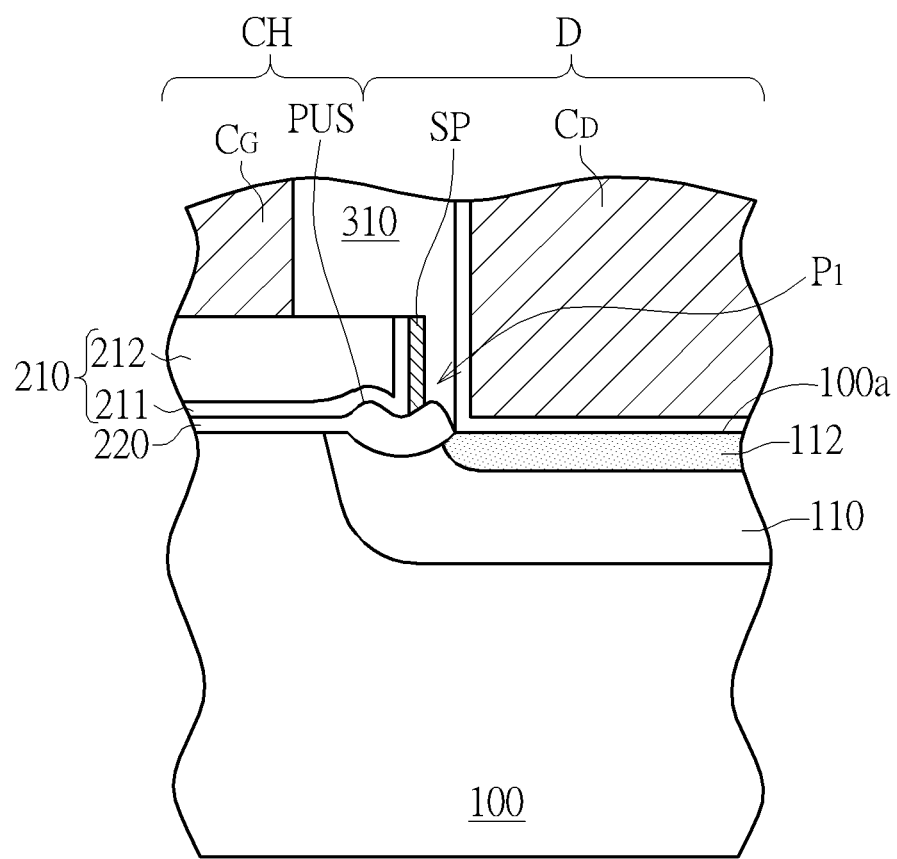

As shown in FIG. 10, a replacement metal gate (RMG) process is then performed to replace the sacrificial gate structure 400 with a metal gate 210. For example, the metal gate 210 may include at least a high dielectric constant material layer 211 and work function metal layer 212, but are not limited thereto. The metal gate 210 overlaps with the first insulating feature P₁, and the thickness of the first insulating feature P₁ is greater than the thickness of the gate oxide layer 220. The first insulating feature P₁ is located in the first lightly doped-drain region 110 between the channel region CH and the first heavily doped region 112. Subsequently, a dielectric layer 310, for example, a silicon oxide layer, may be formed to cover the semiconductor transistor 1, and then contact plugs $C_G$, $C_D$, and the like are formed in the dielectric layer 310.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor transistor, comprising:
   a semiconductor substrate of a first conductivity type having a main surface, wherein a drain region, a source region spaced apart from said drain region, and a channel region between said drain region and said source region are defined in said main surface;
   a first lightly doped-drain region of a second conductivity type disposed in said semiconductor substrate within said drain region;
   a first heavily doped region of said second conductivity type disposed within said first lightly doped-drain region;
   a gate over said channel region;
   a gate oxide layer between said gate and said channel region; and
   a first insulating feature disposed at said main surface and situated within said first lightly doped-drain region between said channel region and said first heavily doped region, wherein said gate overlaps with said first insulating feature, and wherein said first insulating feature is thicker than said gate oxide layer, wherein said first insulating feature comprises an upper portion above said main surface of said semiconductor substrate, wherein said upper portion comprises a top surface having a bow shape in cross-sectional view.

2. The semiconductor transistor according to claim 1, wherein said first conductivity type is P type and said second conductivity type is N type.

3. The semiconductor transistor according to claim 1, wherein said first lightly doped-drain region encompasses the first heavily doped region and isolates said first heavily doped region from said semiconductor substrate.

4. The semiconductor transistor according to claim 1, wherein said first insulating feature is in direct contact with said gate oxide layer.

5. The semiconductor transistor according to claim 1, wherein said first insulating feature comprises a lower portion under said main surface of said semiconductor substrate.

6. The semiconductor transistor according to claim 5, wherein said lower portion encroaches into said main surface of said semiconductor substrate, thereby forming a curved bottom surface of said lower portion under said main surface, and wherein said curved bottom surface of said lower portion is situated between said channel region and said first heavily doped region.

7. The semiconductor transistor according to claim 1, wherein said gate is a metal gate.

8. The semiconductor transistor according to claim 1 further comprising a spacer on a sidewall of said gate.

9. The semiconductor transistor according to claim 8, wherein said spacer is situated on said upper portion.

10. The semiconductor transistor according to claim 1 further comprising:
   a second lightly doped-drain region of a second conductivity type disposed in said semiconductor substrate within said source region;
   a second heavily doped region of said second conductivity type disposed within said second lightly doped-drain region; and
   a second insulating feature disposed at said main surface and situated within said second lightly doped-drain region between said channel region and said second heavily doped region, wherein said gate overlaps with said second insulating feature, and wherein said second insulating feature is thicker than said gate oxide layer.

11. A method for forming a semiconductor transistor, comprising:
   providing a semiconductor substrate of a first conductivity type having a main surface, wherein a drain region, a source region spaced apart from said drain region, and a channel region between said drain region and said source region are defined in said main surface;
   forming a first insulating feature at said main surface, wherein said first insulating feature comprises an upper portion above said main surface of said semiconductor substrate, and wherein said upper portion comprises a top surface having a bow shape in cross-sectional view;
   forming a first lightly doped-drain region of a second conductivity type in said semiconductor substrate within said drain region;
   forming a first heavily doped region of said second conductivity type within said first lightly doped-drain region, wherein said first insulating feature is within said first lightly doped-drain region and between said channel region and said first heavily doped region;
   forming a gate oxide layer on said channel region; and
   forming a gate on said gate oxide layer, wherein said gate overlaps with said first insulating feature, and wherein said first insulating feature is thicker than said gate oxide layer.

12. The method according to claim 11, wherein said first conductivity type is P type and said second conductivity type is N type.

13. The method according to claim 11, wherein said first lightly doped-drain region encompasses the first heavily doped region and isolates said first heavily doped region from said semiconductor substrate.

14. The method according to claim 11, wherein said first insulating feature comprises a lower portion under said main surface of said semiconductor substrate, wherein said lower portion encroaches into said main surface of said semiconductor substrate, thereby forming a curved bottom surface of said lower portion under said main surface, and wherein said curved bottom surface of said lower portion is situated between said channel region and said first heavily doped region.

15. The method according to claim 11, wherein said gate is a metal gate.

16. The method according to claim 11 further comprising:
   forming a spacer on a sidewall of said gate, wherein said spacer is situated on said upper portion.

17. The method according to claim 11 further comprising:
   forming a second lightly doped-drain region of a second conductivity type in said semiconductor substrate within said source region;
   forming a second heavily doped region of said second conductivity type within said second lightly doped-drain region; and
   forming a second insulating feature at said main surface and within said second lightly doped-drain region between said channel region and said second heavily doped region, wherein said gate overlaps with said second insulating feature, and wherein said second insulating feature is thicker than said gate oxide layer.

* * * * *